United States Patent
Pietri et al.

(10) Patent No.: US 8,896,370 B2
(45) Date of Patent: Nov. 25, 2014

(54) SYSTEM AND METHOD FOR CONTROLLING BYPASS OF A VOLTAGE REGULATOR

(71) Applicants: Stefano Pietri, Austin, TX (US); Chris C. Dao, Pflugerville, TX (US); Juxiang Ren, Austin, TX (US); Nicolas Grossier, Vimercate (IT); V Srinivasan, Greater Noida (IN)

(72) Inventors: Stefano Pietri, Austin, TX (US); Chris C. Dao, Pflugerville, TX (US); Juxiang Ren, Austin, TX (US); Nicolas Grossier, Vimercate (IT); V Srinivasan, Greater Noida (IN)

(73) Assignees: Freescale Semiconductor, Inc., Austin, TX (US); STMicroelectronics SRL, Agrate Brianza (IT); STMicroelectronics Private Ltd., Greater Noida (IN)

( * ) Notice: Subject to any disclaimer, the term of this patent is extended or adjusted under 35 U.S.C. 154(b) by 0 days.

(21) Appl. No.: 14/105,419

(22) Filed: Dec. 13, 2013

(65) Prior Publication Data
US 2014/0118036 A1 May 1, 2014

Related U.S. Application Data

(62) Division of application No. 13/482,271, filed on May 29, 2012, now Pat. No. 8,629,713.

(51) Int. Cl.
*G05F 1/10* (2006.01)
*G01R 31/28* (2006.01)
*H03K 17/22* (2006.01)
*G01R 31/40* (2014.01)

(52) U.S. Cl.
CPC ............... *H03K 17/22* (2013.01); *G01R 31/40* (2013.01); *G01R 31/2879* (2013.01)
USPC ............ 327/540; 327/538; 327/143; 327/198

(58) Field of Classification Search
USPC ......... 327/540, 530, 538, 541, 543, 544, 545, 327/546, 74, 77, 78, 79, 143, 198; 307/18, 307/23, 30, 33, 64, 71, 80, 81, 85, 86; 323/282, 284, 285, 299
See application file for complete search history.

(56) References Cited

U.S. PATENT DOCUMENTS

| | | | |
|---|---|---|---|
| 5,625,280 | A | 4/1997 | Voldman |
| 5,627,413 | A | 5/1997 | Mughir et al. |
| 5,770,959 | A | 6/1998 | Hopkins et al. |
| 6,218,738 | B1 | 4/2001 | Fujishima |
| 6,664,767 | B2 | 12/2003 | Takahashi et al. |
| 7,212,067 | B2 | 5/2007 | Pasternak |
| 7,391,193 | B2 | 6/2008 | Wang et al. |
| 7,692,403 | B2 | 4/2010 | Chuang et al. |
| 2007/0236279 | A1 | 10/2007 | Novak |
| 2009/0115389 | A1 | 5/2009 | Chu et al. |
| 2009/0167274 | A1 | 7/2009 | Chien et al. |
| 2010/0109624 | A1 | 5/2010 | Lourens et al. |
| 2011/0148482 | A1 | 6/2011 | Gussoni et al. |

*Primary Examiner* — Lincoln Donovan
*Assistant Examiner* — Jung H Kim (57) ABSTRACT

A voltage regulator bypass circuit to control bypass of a voltage regulator of an integrated circuit device, the voltage regulator bypass circuit including a first voltage detector, a second voltage detector, and circuit. The first voltage detector to detect that a core circuitry voltage level is above a first threshold and to assert a first detect signal at an output in response to the detection. The second voltage detector to detect that an unregulated supply voltage is above a second threshold and to assert a second detect signal at an output in response to the detection. The circuit having a first input coupled to the output of the first voltage detector and a second input coupled to the output of the second voltage detector, the circuit to bypass the voltage regulator in response the output of the latch being cleared.

20 Claims, 5 Drawing Sheets

SYSTEM AND METHOD FOR CONTROLLING BYPASS OF A VOLTAGE REGULATOR

CROSS-REFERENCE TO RELATED APPLICATION(S)

The present application is a divisional of U.S. patent application Ser. No. 13/482,271, entitled "System and Method for Controlling Bypass of a Voltage Regulator," filed on May 29, 2012, the entirety of which is herein incorporated by reference.

FIELD OF THE DISCLOSURE

This disclosure generally relates to a system and method for controlling bypass of a voltage regulator.

BACKGROUND

In normal, or non-test, operation, a voltage regulator typically is used to provide a regulated voltage to core circuitry of an integrated circuit (IC). However, in order to accurately test the integrated circuit, the voltage regulator can be bypassed so as to allow an external power supply to power the core circuitry of the IC during test operation. This test operation typically is initiated via a test mode signal supplied to an external pin of the IC. A spurious event, such as an unintended assertion of the test mode signal during normal operation, could cause the improper bypass of the voltage regulator and thereby cause the IC to operate erratically, which is of particular concern in critical applications.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

FIGS. 1-5 illustrate example techniques for reducing the likelihood of inadvertent bypass of a voltage regulator in an integrated circuit (IC) device. The IC device includes a voltage regulator, core circuitry, and a voltage regulator bypass circuit. During non-test operation, the voltage regulator provides a regulated voltage to the core circuitry of the IC device. However, during a start-up of the IC device, a test mode can be entered and the voltage regulator thus bypassed if at least three fail-safe conditions are met. In at least one embodiment, entry to the test mode is initiated solely by the assertion of a test mode signal at an input to the IC device, and thus the first fail-safe condition is that a test mode signal has been asserted at an external pin of the IC device during the start-up phase. The absence of the asserted test mode signal is a clear indication that a test-mode operation is not intended.

Further, if the IC device is to be tested, the IC device would be supplied by a well-regulated supply voltage other than the onboard voltage regulator so as to ensure a clean supply voltage for test purposes. The supply of this externally regulated voltage (referred to herein as "Vtest") would result in the voltage supplied to the core circuitry (referred to herein as the "core circuitry supply voltage") rising above a voltage threshold that would be expected if the IC device were coming out of a power-on reset (POR) during a normal test mode. Thus, the second fail-safe condition is that the core circuitry supply voltage rises above this threshold level during the start-up phase. Otherwise, it is unlikely that the IC device is being tested and thus the assertion of the test signal is treated as a spurious, unintended event.

As the onboard voltage regulator supplies voltage to the core circuitry, it is possible that the core circuitry supply voltage detected with respect to the second fail-safe condition could be a result of regulated power supplied by the onboard voltage regulator rather than an external test apparatus. Thus, to eliminate this scenario, the third fail-safe condition can be that the core circuitry supply voltage detected for the second fail-safe condition is not a result of a voltage supplied by the onboard voltage regulator. Typically, during a test mode operation of the IC device, rather than supply an unregulated supply voltage (referred to herein as "Vin") at a particular pin, the IC device instead is supplied with the well-regulated test voltage Vtest at a different input of the IC device. Thus, if the IC device is to be tested under these circumstances the core circuitry supply voltage would be expected to rise above the above-described voltage threshold while the voltage level of the input at which the unregulated supply voltage Vin would otherwise be expected does not rise above a corresponding power-on threshold. Accordingly, the third fail-safe condition can be assessed by verifying that the core circuitry supply voltage has risen above its corresponding voltage threshold before the input which typically receives the unregulated voltage has risen above its corresponding voltage threshold. This third condition being met signals that the core circuitry supply voltage results from the supply of voltage by an external source (i.e., not by the onboard voltage regulator) as would be expected consistent with a test mode operation.

In one embodiment, the meeting of all three fail-safe conditions is deemed sufficient indicia that a test mode operation is intended, and thus the voltage regulator bypass circuit can assert a bypass mode signal, in response to which the voltage regulator is disabled or otherwise bypassed. The assertion of the bypass mode signal also can signal to the core circuitry that the bypass mode of the voltage regulator is being enabled, and thus enabling a debug mode of the core circuitry so as to enable testing of the core circuitry. The voltage regulator bypass circuit can signal an exit from the bypass mode of the voltage regulator and enable the voltage regulator in response to one or both of the core circuitry supply voltage or the unregulated supply voltage falling below respective voltage thresholds, which indicate that supply voltage has been removed from the IC device and thus signals an end or termination of the test-mode operation.

Figure 1:
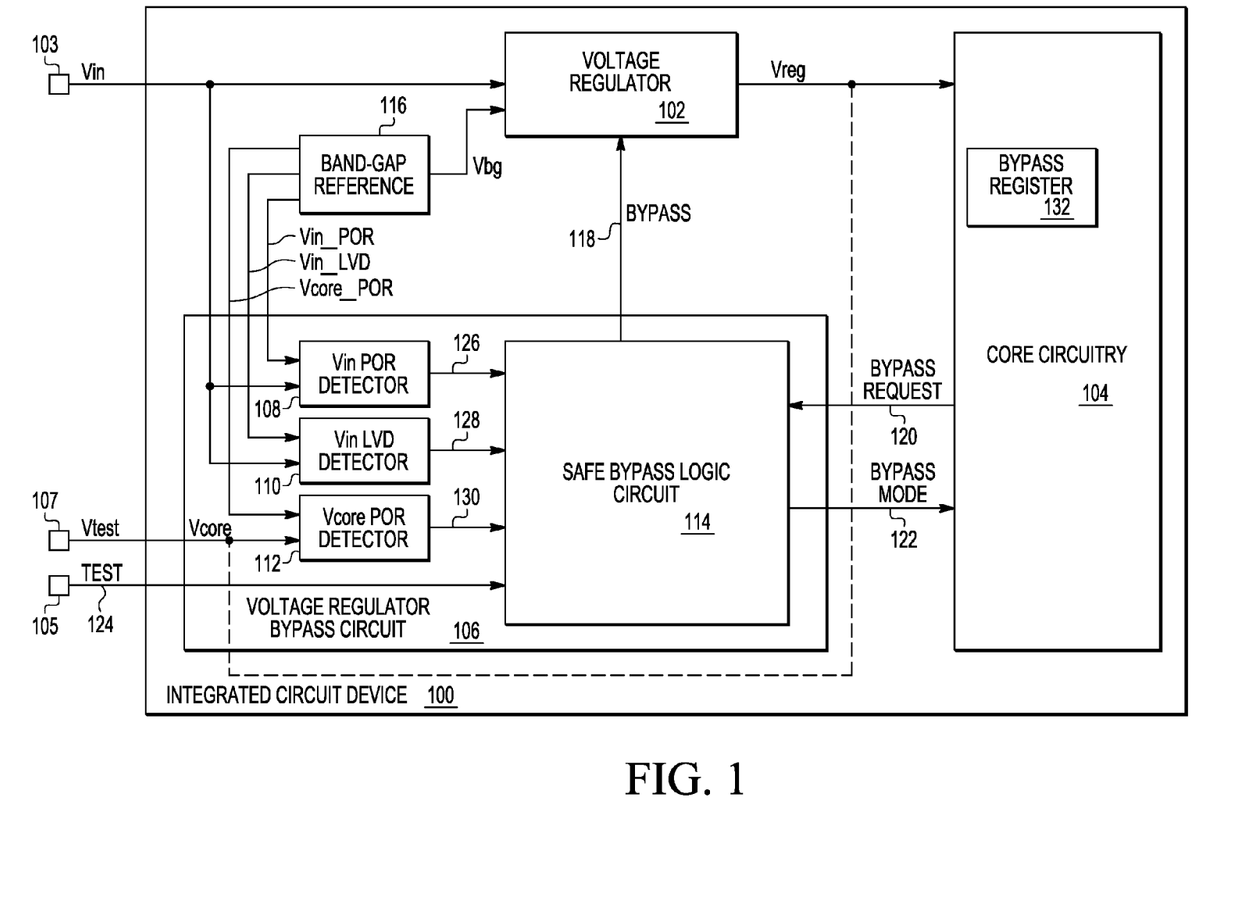
FIG. 1 is a block diagram illustrating an integrated circuit (IC) device implementing a voltage regulator bypass circuit in accordance with at least one embodiment of the present disclosure.

FIG. 1 illustrates a diagram of an integrated circuit (IC) device 100 implementing controlled voltage regulator bypass in accordance with at least one embodiment of the present disclosure. The IC device 100 can be implemented as, for example, an application-critical control component, such as an engine control unit (ECU) or other safety circuit of an automobile or other vehicle (e.g., an anti-lock braking circuit, an airbag deploying circuit, and the like) for which an unintended entry into bypass mode could have disastrous implications. In the depicted example, the IC device 100 includes a voltage regulator 102, core circuitry 104, a voltage regulator bypass circuit 106, and a band-gap reference circuit 116. The voltage regulator bypass circuit 106 includes an unregulated supply voltage power-on reset (Vin POR) detector 108, a Vin low voltage detect (LVD) detector 110, a core voltage (Vcore) POR detector 112 (collectively, "voltage detectors 108-112"), a safe bypass logic circuit 114, and a band-gap reference 116.

The voltage regulator 102 includes an input to receive the unregulated (or loosely regulated) supply voltage Vin via an external pin 103 of the IC device 100, an input to receive a regulator reference voltage Vbg from the band gap reference 116, an input to receive a bypass mode signal 118, and an output to provide a regulated voltage Vreg. The core circuitry 104 includes an input coupled to the output of the voltage regulator 102 so as to receive the regulated voltage Vreg, an output that couples the core circuitry 104 to the voltage regulator bypass circuit 106 and provides a bypass request signal 120 to the safe bypass logic circuit 114, and an input coupled to the voltage regulator bypass circuit 106 to receive a bypass mode signal 122. The bypass mode signals 118 and 122 may be the same signal or separate signals.

The voltage regulator bypass circuit 106 includes an input to receive the unregulated supply voltage Vin, an input coupled to the band gap reference 116 to provide the reference voltage Vbg to the voltage detectors 108-112, an input coupled to the core circuitry 104 to receive the bypass request signal 120, an input to coupled to an external pin 105 of the IC device 100 to receive a test mode signal 124, an input to receive a core logic supply voltage Vcore, and an output coupled to the core circuitry 104 to provide the bypass mode signal 122 when a regulator bypass mode is entered. The voltage Vcore is provided by either an external regulator as voltage Vtest via an external pin 107 of the IC device 100 during a test mode or is provided by the internal voltage regulator 102 as regulated voltage Vreg during a normal, or non-test, mode. During test mode, the voltage Vtest can be varied, and thus varying the voltage Vcore, such that the core circuitry 104 can be tested at various operating voltages.

In addition to providing the reference voltage Vbg, the band-gap reference 116 provides reference voltages used as threshold voltages during the voltage regulator bypass decision process. These threshold voltages can include: a threshold voltage Vin_POR that represents a voltage level of the unregulated supply voltage Vin is expected to drop below during a power-on reset or other start-up of the IC device 100; a threshold voltage Vin_LVD that represents the minimum voltage level of the unregulated supply voltage Vin at which the voltage regulator 102 and the band-gap reference 116 correctly function; and a threshold voltage Vcore_POR that represents a voltage level of the core circuitry supply voltage Vcore is excepted to drop below during a power-on reset or other start-up of the IC device 100. As an example, the threshold voltage Vin_POR could be approximately 2.7 volts (V), the threshold voltage Vin_LVD could be a voltage between 2.7-3 V, and the threshold voltage Vcore_POR could be approximately 0.7 V. These reference voltages may be programmable or tunable during operation, or may be fixed at time of manufacture of the IC device 100.

The Vin POR detector 108 includes an input to receive unregulated supply voltage Vin, an input to receive the reference voltage Vin_POR, and an output to assert a Vin_POR_detect signal 126 responsive to a comparison of the unregulated supply voltage Vin and the reference voltage Vin_POR indicating that Vin is greater than Vin_POR. The Vin LVD detector 110 includes an input to receive unregulated supply voltage Vin, an input to receive the reference voltage Vin_LVD, and an output to assert a Vin_LVD_detect signal 128 responsive to a comparison of the unregulated supply voltage Vin and the reference voltage Vin_LVD indicating that Vin>Vin_LVD. The Vcore POR detector 112 includes an input to receive the supply voltage Vcore (which may be Vin or Vtest depending on mode), an input to receive the reference voltage Vcore_POR, and an output to assert a Vcore_POR_detect signal 130 responsive to a comparison of the unregulated supply voltage Vin and the reference voltage Vcore_POR indicating that Vcore is greater than Vcore_POR.

The safe bypass logic circuit 114 includes an input coupled to the output of the Vin POR detector 108, an input coupled to the output of the Vin LVD detector 110, an input coupled to output of the Vcore POR detector 112, an input coupled to the external pin 107 to receive the test mode signal 124, and an input coupled to the output of the core circuitry 104. The safe bypass logic circuit 114 also includes an output coupled to the voltage regulator 102 to provide the bypass mode signal 118 and an output coupled to the core circuitry 104 to provide the bypass mode signal 122.

During a non-test operation of the IC device 100, the voltage regulator 102 receives the unregulated supply voltage Vin and provides the regulated voltage Vreg to the core circuitry 104. However, during a start-up of the IC device 100, the voltage regulator bypass circuit 106 monitors for the above-described particular combination of conditions that definitively indicate a test mode and thus would permit the voltage regulator 102 to be bypassed. If this particular combination of conditions is not met during start-up, the safe bypass logic circuit 114 will not assert the bypass signal 118 to the voltage regulator 102, thereby enabling the voltage regulator 102 to initiate and begin supplying the regulated voltage Vreg. If this particular combination of conditions is met during start-up, the safe bypass logic circuit 114 asserts the bypass signal 118, thereby disabling or bypassing the voltage regulator 102 and thus allowing a test mode to be entered. In at least one embodiment, the status of the voltage regulator 102 (e.g., normal or bypassed) is indicated to the core circuitry 104 by setting a value or state of a bypass register 132 via the bypass mode signal 122.

From the foregoing, the voltage regulator bypass circuit 106 can be designed such that before permitting bypass of the voltage regulator 102, the safe bypass logic circuit 114 has to detect that an entry into a test mode is indicated by signaling on the external test pin 105 of the IC device 100, that the core voltage Vcore is above a threshold, such as the Vcore_POR, and that the core voltage Vcore is being supplied by an external supply source, rather than from the voltage regulator 102. Thus, the voltage regulator bypass circuit 106 only bypasses the voltage regulator 102 when each of the events occurs in the proper sequence to ensure that the bypass mode of the voltage regulator 102 is not entered by mistake. Therefore, the voltage regulator bypass circuit 106 does not have a single point of failure. For example, even if the test mode signal 124 is supplied to the voltage regulator bypass circuit 106 by mistake but the unregulated supply voltage Vin has risen above both of the one or more thresholds before the core voltage Vcore has risen above both of the one or more thresholds, then the voltage regulator bypass circuit 106 will not bypass the voltage regulator 102. This fail-safe operation thus avoids potentially disastrous consequences of inadvertently entering a test mode when the system employing the IC device 100 is expecting or relying on the IC device 100 to be in a normal, non-test mode.

Figure 2:
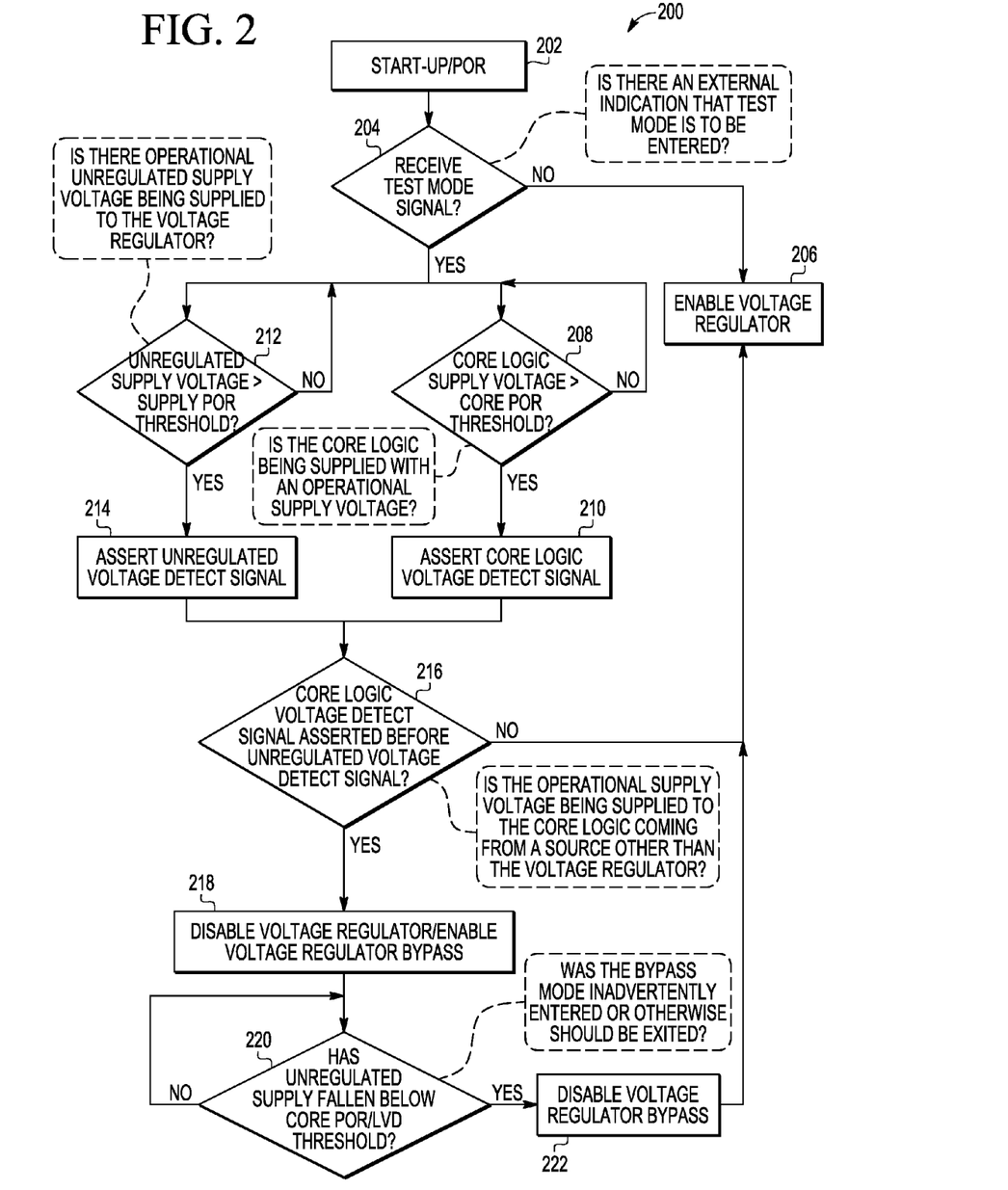
FIG. 2 is a flow diagram illustrating an operation of the voltage regulator bypass circuit of FIG. 1 in accordance with at least one embodiment of the present disclosure.

FIG. 2 is a flow diagram of a method 200 of operation of the voltage regulator bypass circuit 106 of the IC device 100 in accordance with at least one embodiment of the present disclosure. At block 202, a start-up of the IC device 100 is initiated by a power-on reset or other initial application of power. During the start-up phase, the voltage regulator bypass circuit 106 monitors for the three fail-safe conditions to determine whether to enter a test mode or a non-test, or normal, mode. As noted above, a first fail-safe condition is that the test mode is initiated externally and thus there should be an external indication that the test mode is to be entered. To determine whether this condition is met, at block 204 the safe bypass logic circuit 114 monitors the external pin 105 to detect whether the test mode signal 124 is asserted during the start-up phase. If the first fail-safe condition is not met (that is, an assertion of the test mode signal 124 is not detected during start-up), at block 206 the safe bypass logic circuit 114 enables the voltage regulator 102 to provide the regulated voltage Vreg to the core circuitry 104 by maintaining the bypass mode signal 118 in a deasserted state, and the IC device 100 enters a non-test mode.

Otherwise, if the first fail-safe condition is met (that is, an assertion of the test mode signal 124 is detected), the voltage regulator bypass circuit 106 monitors for the second fail-safe condition, namely that the core circuitry 104 is being supplied with the operational voltage during the start up mode. As noted above, the minimum threshold for this operational voltage is supplied as the reference voltage Vcore_POR, which represents the voltage the core circuitry supply voltage Vcore is expected to drop below during a power-on reset or other start-up of the IC device 100 in the absence of a test mode. Accordingly, at block 208 the Vcore POR detector 112 compares the core circuitry supply voltage Vcore with the reference voltage Vcore_POR. If the core circuitry supply voltage Vcore rises above the reference voltage Vcore_POR during start-up mode, at block 210 the Vcore POR detector 112 asserts the Vcore_POR_detect signal 130 to signal that this second condition has been met. Otherwise, if the core circuitry supply voltage Vcore does not rise above the reference voltage Vcore_POR during start-up mode, the Vcore POR detector 112 maintains the Vcore POR detect signal 130 in a deasserted state, and thus the safe bypass logic circuit 114 maintains the bypass mode signal 118 in a deasserted state.

In parallel, the voltage regulator bypass circuit 106 monitors the unregulated supply voltage Vin to determine whether an operational voltage is being supplied via the pin 103. As noted above, the minimum threshold for this operational voltage is supplied as the reference voltage Vin_POR, which represents the voltage expected for unregulated supply voltage Vin during power-on reset in the absence of a test mode. Accordingly, at block 212, the Vin POR detector 108 compares the unregulated supply voltage Vin with the reference voltage Vin_POR. If unregulated supply voltage Vin rises above the reference voltage Vin_POR during start-up mode, at block 214 the Vin POR detector 108 asserts the Vin_POR_detect signal 126.

As noted above, the core circuitry supply voltage Vcore could be at an operational level during start-up mode due to the voltage Vreg provided by the voltage regulator 102, rather than due to the application of an external test voltage Vtest that generates the core circuitry supply voltage. Accordingly, if the second fail-safe condition is met (the core circuitry supply voltage is greater than the threshold Vcore_POR), the voltage regulator bypass circuit 106 monitors for the third fail-safe condition: that the second fail-safe condition is the result of application of the test voltage Vtest rather than a voltage provided by the voltage regulator 102. Since the core circuitry supply voltage Vcore cannot be greater than the voltage Vreg output by the voltage regulator 102 if it is in fact the voltage regulator 102 supplying the voltage Vcore during the start up mode, this third condition can be considered to be met if the core circuitry voltage Vcore rises above the threshold voltage Vcore_POR before the unregulated supply voltage Vin rises above the threshold voltage Vin_POR. Accordingly, at block 216 the safe bypass logic circuit 114 determines whether the Vcore POR detector 112 has asserted the Vcore_POR_detect signal 130 before the Vcore POR detector 108 has asserted the Vin_POR_detect signal 126 (if at all). If not, it is likely that the core circuitry supply voltage Vcore represents the regulated voltage Vreg and thus the safe bypass logic circuit 114 does not disable the voltage regulator 102 and the non-test mode is entered at block 206. If the Vcore_POR_detect signal 130 is asserted first (or the only one of the two asserted), then the core circuitry supply voltage Vcore is determined as being supplied by an external supply (i.e., the voltage Vtest) and thus the third fail-safe condition is met.

With all three fail-safe conditions met, at block 218 the safe bypass logic circuit 114 asserts the bypass mode signal 118 to signal entry into the test mode, thereby disabling the voltage regulator 102 or bypassing the use of the regulated voltage Vreg as the core circuitry supply voltage Vcore in favor of the externally-supplied voltage Vtest.

In one embodiment, the test mode is exited by a power-on reset of the IC device 100. Accordingly, the voltage regulator bypass circuit 106 can ensure proper exit from the test mode into a state whereby the voltage regulator 102 is no longer bypassed by monitoring the unregulated supply voltage Vin at block 220. In the event that the unregulated supply voltage Vin falls below the threshold voltage Vin_LVD (representing the minimum standby voltage expected to maintain the core circuitry 104 in a standby or sleep state), the Vin LVD detector 110 asserts the Vin_LVD_detect signal 128, in response to which the safe bypass logic circuit 114 deasserts the bypass mode signal 118 at block 222, thereby enabling the voltage regulator 102 and the use of the regulated voltage Vreg as the core circuitry supply voltage Vcore as described above at block 206.

Figure 3:
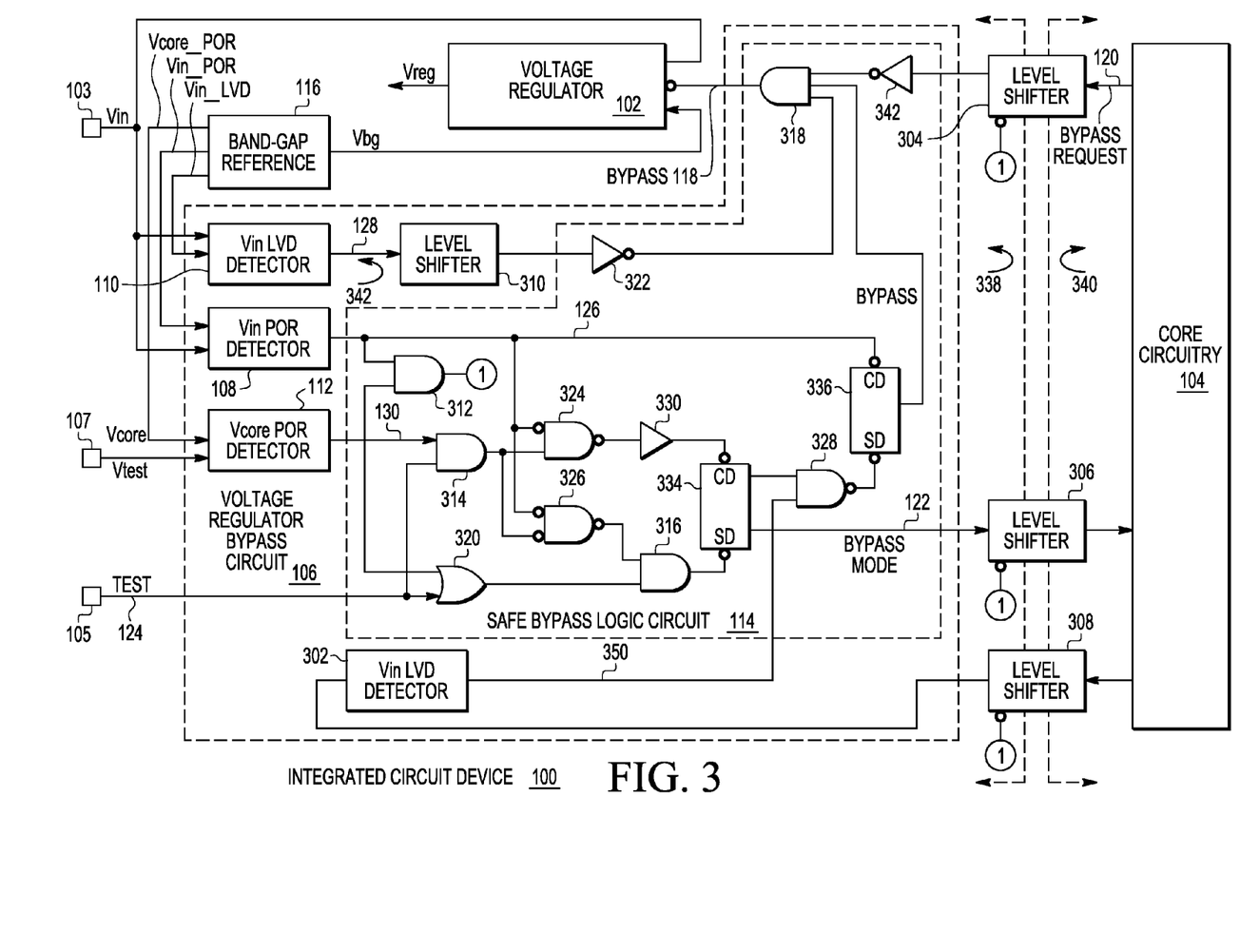
FIG. 3 is a block and digital logic diagram of the voltage regulator bypass circuit of FIG. 1 in accordance with at least one embodiment of the present disclosure.

FIG. 3 illustrates the IC device 100 with the voltage regulator bypass circuit 106 shown in greater detail in accordance with at least one embodiment of the present disclosure. The voltage regulator bypass circuit 106 includes voltage level shifters 304, 306, 308, and 310, the voltage detectors 108-112, the safe bypass logic circuit 114, and a Vin LVD detector 302. The safe bypass logic circuit 114 includes AND gates 312-318, OR gate 320, inverters 322 and 332, NAND gates 324-328, a delay buffer 330, and set/reset latches 334 and 336. The voltage level shifters can convert a signal from a first voltage domain to a second voltage domain, such as a bypass circuit voltage domain 338, and a core circuitry voltage domain 340.

The level shifter 310 includes an input coupled to the output of the Vin LVD detector 110 to receive the Vin_LVD_detect signal 128, and an output. The inverter 322 includes an input coupled to the output of the level shifter 310, and an output. The AND gate 318 includes an input to receive an inverted signal of the bypass request signal 120, an input to received an inverted signal of the Vin_LVD_detect signal 128, another input, and an output coupled to the input of the voltage regulator 102 to assert the bypass mode signal 118.

The Vin POR detector 108 includes an input to receive the reference voltage Vin_POR, an input to receive the unregulated supply voltage Vin, and an output to provide the Vin_POR_detect signal 126. The Vcore POR detector 112 includes an input to receive the supply voltage Vcore (which may be Vreg or Vtest depending on the mode), an input to receive the voltage reference Vcore_POR, and an output to provide the Vcore_POR_detect signal 130.

The Vin LVD detector 302 includes an input, and an output. The AND gate 312 includes an input coupled to the output of the Vin POR detector 108 to receive the Vin_POR_detect signal 126, an input coupled to the output of the Vcore POR detector 112 to receive the Vcore_POR_detect signal 130, and an output. The AND gate 314 includes an input coupled to the output of the Vcore POR detector 112 to receive the Vcore_POR_detect signal 130, an input coupled to the external test pin 105 to receive the test enable signal 124, and an output.

The OR gate 320 includes an input coupled to the external test pin 105 to receive the test enable signal 124, an input coupled to the output of the Vcore POR detector 112 to receive the Vcore_POR_detect signal 130, and an output. The NAND gate 324 includes an input coupled to the output of the Vin POR detector 108 to receive the Vin_POR_detect signal 126, an input coupled to the output of the AND gate 314, and an output. The NAND gate 326 includes an input coupled to the output of the Vin POR detector 108 to receive the Vin_POR_detect signal 126, an input coupled to the output of the AND gate 314, and an output. The delay buffer 330 includes an input coupled to the output of the NAND gate 324, and an output. The AND gate 316 includes an input coupled to the output of the NAND gate 326, an input coupled to the output of the OR gate 320, and an output.

The set/reset latch 334 includes a clear input coupled to the output of the delay buffer 330, a set input coupled to the output of the AND gate 316, a first output, and a second output. The NAND gate 328 includes an input coupled to the first output of the set/reset latch 334, a second input coupled to the output of the Vin LVD detector 302, and an output. The set/reset latch 336 includes a clear input coupled to the output of the Vin POR detector 108 to receive the Vin_POR_detect signal 126, a set input coupled to the output of the NAND gate 328, and an output coupled to the second input of the AND gate 318.

The level shifter 304 includes an input to receive the bypass request signal 120 from the core circuitry 104, an input coupled to the output of the AND gate 312, and an output. The inverter 332 includes an input coupled to the output of the level shifter 304, and an output coupled to an input of the AND gate 318. The level shifter 306 includes an input coupled to the output of the set/reset latch 334, and an output. The level shifter 308 includes an input coupled to the core circuitry 104, an input coupled to the output of the AND gate 312, and an output coupled to the input of the Vin LVD detector 302.

During a non-test operation, the voltage regulator 102 regulates an unregulated supply voltage, e.g. five volts, which can be a voltage level of the bypass circuit voltage domain 338, to a regulated supply voltage, e.g. 1.2 volts that can be the voltage level of the core circuitry voltage domain 340, and provides the regulated supply voltage to the core circuitry 104. Thus, during normal, or non-test, operation, the voltage regulator 102 is powered up before the core circuitry 104 is powered up so that the core circuitry 104 can receive the regulated voltage from the voltage regulator 102. During a test mode of the core circuitry 104, such as during a manufacturing of the IC device 100, the voltage regulator 102 may be disabled or bypassed so that the external voltage supply can be provided. The voltage regulator bypass circuit 106 can control when the voltage regulator 102 is bypassed so that the voltage regulator 102 is only bypassed during true test modes.

The voltage regulator bypass circuit 106 can be designed such that before the voltage regulator 102 is bypassed, the safe bypass logic circuit 114 has to detect the test mode signal 124 on the external test pin, that the core voltage Vcore is above the core voltage POR level, and then after the first two events that the unregulated supply voltage Vin has to rise above both the Vin_POR and the Vin_LVD thresholds. Thus, the voltage regulator bypass circuit 106 only bypasses the voltage regulator 102 when the events occur in the proper sequence.

The Vin LVD detector 110 can determine whether the unregulated voltage Vin rises above Vin_LVD. If the unregulated voltage Vin is below the Vin_LVD, the Vin LVD detector 110 can provide the Vin_LVD_detect signal 128 having a low digital logic voltage or not provide a signal on the output of the Vin LVD detector 110. However, when the Vin LVD detector 110 detects that the unregulated Vin has risen above the Vin_LVD, the Vin LVD detector 110 can provide the Vin_LVD_detect signal 128 having a high digital logic voltage. The Vin_LVD_detect signal 128 provided from the Vin LVD detector 110 is then provided to the level shifter 310, which in turn converts the Vin_LVD_detect signal 128 from an external voltage domain 342 to the voltage regulator bypass circuit voltage domain 338.

When the Vin_LVD_detect signal 128 has be converted to the voltage domain 338, the Vin_LVD_detect signal 128 is provided to the first input of the inverter 322. If the Vin_LVD_detect signal 128 has the low digital logic voltage or no signal is provided, which indicates that the Vin has not risen above the Vin_LVD, then a regulator bypass signal having a high digital logic voltage can be provided from the output of the inverter 322. However, if the Vin_LVD_detect signal 128 has a high digital logic voltage, indicating that the unregulated voltage Vin has risen above the LVD threshold level, then a regulator bypass signal having a low digital logic voltage can be provided from the output of the inverter 322.

The Vin POR detector 108 can determine whether the unregulated supply voltage Vin rises above Vin_POR, which is provided from the band-gap reference circuit 116 to the Vin POR detector 108. If the unregulated voltage Vin is below the Vin_POR, the Vin POR detector 108 can assert the Vin_POR_detect signal 126 having a low digital logic voltage or the Vin POR detector 108 cannot provide a signal. However, when the Vin POR detector 108 detects that the unregulated voltage Vin has risen above the Vin_POR, the Vin POR detector 108 asserts the Vin_POR_detect signal 126 having a high digital logic voltage.

The Vcore POR detector 112 can determine whether the core voltage Vcore rises above the Vcore_POR, which is provided from the band-gap reference circuit 116 to the Vcore POR detector 112. If the core voltage Vcore is below the Vcore_POR, the Vcore POR detector 112 asserts the Vcore_POR_detect signal 130 having a low digital logic voltage. However, when the Vcore POR detector 112 detects that the core voltage Vcore has risen above Vcore_POR, the Vcore POR detector 112 asserts the Vcore_POR_detect signal 130 having a high digital logic voltage.

The Vin LVD detector 302 can determine whether the unregulated supply voltage Vin rises above a threshold level. The threshold level for the Vin LVD detector 302 can be a higher threshold level than the threshold level provided to the Vin_LVD_detector 110. If the unregulated supply voltage Vin is below the threshold level, the detector 302 asserts a Vin_POR_detect signal 350 having a low digital logic voltage. However, when the detector 302 detects that the unregulated voltage Vin has risen above both the threshold level, the detector 302 asserts the Vin_POR_detect signal 350 having a high digital logic voltage.

The AND gate 312 can receive the Vin_POR_detect signal 126 and the Vcore_POR_detect signal 130, and can output a signal having a high logic voltage to the level shifters 304, 306, and 308, shown by the '1' reference, to indicate that the unregulated voltage Vin and the core circuitry voltage Vcore are both at the proper voltages. The signal from the AND gate 312 can enable the level shifters 304, 306, and 308. Thus, the level shifters 304, 306, and 308 are not enabled unless both Vin and Vcore are at the proper voltages.

Entry into a test mode is indicated by an assertion of the test mode signal 124 on the external test pin 105. However, the voltage regulator bypass circuit 106 is configured so as to only enter the bypass mode of the voltage regulator 102 when all three fail-safe conditions are met. The first condition is that the test mode signal is received and that the core voltage Vcore has risen above both the Vcore_POR. The second is that the unregulated voltage Vin has risen above both Vin_POR and Vin_LVD. The third condition is that both the test mode signal is received and that the core voltage has risen above Vcore_POR prior to when the Vin POR detector 108 detects that the voltage unregulated voltage Vin has risen above the Vin POR level. The voltage regulator bypass circuit 106 can use the test mode signal 124, the Vcore_POR_detect signal 130, and the Vin_POR_detect signal 126 to verify that all of the conditions are met in the proper sequence. Therefore, the voltage regulator bypass circuit 106 does not have a single point of failure.

As the Vin_POR_detect signal 126 and the Vcore_POR_detect signal 130 propagate through the logic elements of the safe bypass logic circuit 114, the delay buffer 330 can provide a desired delay period before an output signal from NAND gate 324 is provided to the clear of the set/reset latch 334 to make sure that the set/reset latch 334 is cleared only when both the test mode signal 124 is received and the core voltage Vcore has risen above Vcore_POR before the unregulated voltage Vin has risen above the unregulated voltage Vin POR level. When the set/reset latch 334 is cleared, the set/reset latch can provide the bypass mode signal 122 having a high logic voltage to the shifter register 306, which in turn converts the bypass mode signal 122 to the core circuitry voltage domain 340. The bypass mode signal 122 is then provided to the core circuitry 104 to indicate that a test mode has been entered.

The set/reset latch 334 can control the set/reset latch 336, which in turn can cause the AND gate 318 to either provide or not provide the bypass signal 118 to the voltage regulator 102. Thus, the voltage regulator bypass circuit 106 can bypass the voltage regulator 102 when the test mode signal 124 is received via the external test pin 105, the core circuitry supply voltage Vcore has risen above the Vcore_POR, and then after both of these events the unregulated voltage Vin has risen above the Vin_POR. In one embodiment, the bypass of the voltage regulator 102 can also be controlled by reception of the bypass request signal 120 from the bypass register 132 of FIG. 1 within the core circuitry 104. The bypass request signal 120 indicates a request that the voltage regulator be powered down. The internal register 132 can be set in response to the bypass mode signal 122 received from the set/reset latch 334. The level shifter 304 can receive the bypass request signal 120 from the internal register 132, convert the bypass request signal 120 from the core circuitry voltage domain 340 to the bypass circuit voltage domain 338, and then provide the bypass request signal 120 to the voltage regulator 102 via the inverter 332 and the AND gate 318. However, if the voltage regulator 102 was placed into the bypass mode by a signal being received in error, the bit in the internal register 132 can be cleared and the voltage regulator 102 can be enabled in response to the bypass request signal 120 being deasserted. When the voltage regulator 102 has been enabled, the voltage regulator 102 can provide the core circuitry 104 with the regulated voltage Vreg.

Figure 4:
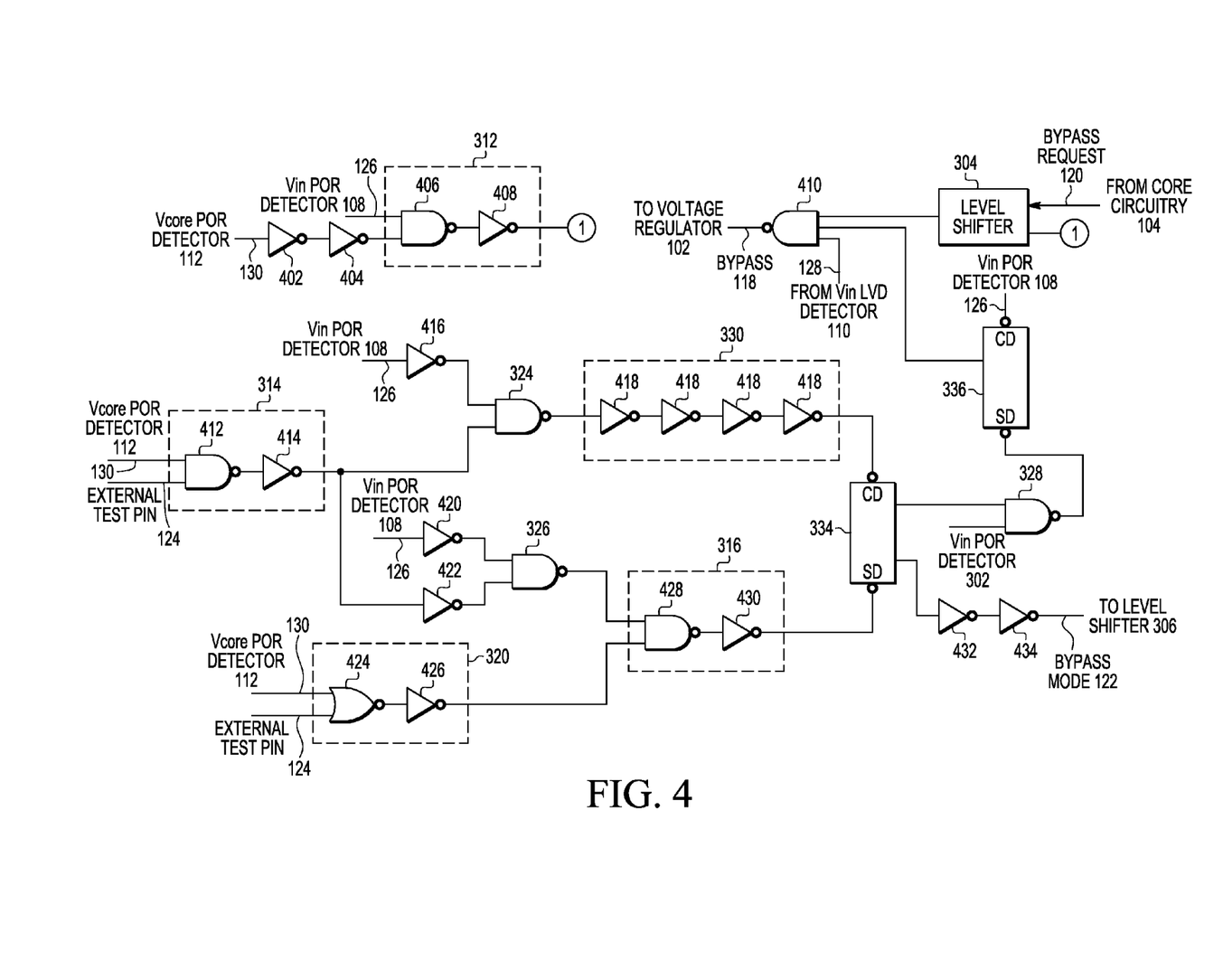
FIG. 4 is an alternative block and digital logic diagram of the voltage regulator bypass circuit of FIG. 3 in accordance with at least one embodiment of the present disclosure.

FIG. 4 shows an example implementation of the voltage regulator bypass circuit 106 of FIGS. 1 and 3 including inverters 402, 404, 414, 416, 418, 420, 422, 426, 430, 432, and 434, NAND gates 406, 410, 412, and 428, NOR gate 424. The voltage regulator bypass circuit 106 also includes the level shifter 304, the NAND gates 324, 326, and 328, and the set/reset latches 334 and 336. The inverter 402 includes an input coupled to the output of Vcore POR detector 112 to receive the Vcore_POR_detect signal 130, and an output.

The inverter 404 includes an input coupled to the output of the inverter 402, and an output. The AND gate 312 of FIG. 3 is implemented via the NAND gate 406 and the inverter 408. The NAND gate 406 includes an input coupled to the output of the Vin POR detector 108 to receive the Vin_POR_detector signal 126, an input coupled to the output of the inverter 404, and an output. The inverter 408 includes an input coupled to the output of NAND gate 406, and an output coupled to the input of the level shifter 304.

The AND gate 318 and the inverter 332 of FIG. 3 are implemented as the NAND gate 410 in FIG. 4. The NAND gate 410 includes an input coupled to the output of the level shifter 304 to receive the bypass mode request signal 120, an input coupled the output of the set/reset latch 336, an input coupled to the output of the Vin LVD detector 110 to receive the Vin_LVD_detect signal 128, and an output coupled to the voltage regulator 102. The AND gate 312 of FIG. 3 can be implemented with the NAND gate 412 and inverter 414 in FIG. 4. The NAND gate 412 includes an input coupled to the output of the Vcore POR detector 112 to receive the Vcore_POR_detect signal 130, an input coupled to the external test pin 105 to receive the test mode signal 124, and an output. The inverter 414 includes an input coupled to the output of the NAND gate 412, and an output.

Inverter 416 includes an input coupled to the output of Vin POR detector 108 to receive the Vin_POR_detect signal 126, and an output. The NAND gate 324 includes an input coupled to the output of the inverter 416 to provide an inverted Vin_POR_detect signal 126 to the NAND gate 324, an input coupled to the output of the inverter 414, and an output. The delay buffer 330 of FIG. 3 can be implemented using multiple inverters, such as inverters 418, connected in series. The inverter 420 includes an input coupled to the output of the Vin POR detector 108 to receive the Vin_POR_detect signal 126, and an output. The inverter 422 includes an input coupled to the output of the inverter 414, and an output. The NAND gate 326 includes a first coupled to the output of the inverter 420 to provide a first inverted input, a second input coupled to the output of the inverter 422 to provide a second inverted input, and an output.

The OR gate 320 of FIG. 3 can be implemented in FIG. 4 via the NOR gate 424 and an inverter 426. The NOR gate 424 includes an input coupled to the output of the Vcore POR detector 112 to receive the Vcore_POR_detect signal 130, an input coupled to the external test pin 105 to receive the test mode signal 124, and an output. The inverter 426 includes an input coupled to the output of the NOR gate 424, and an output. The AND gate 316 of FIG. 3 can be implemented in FIG. 4 via the NAND gate 428 and an inverter 430. The NAND gate 428 includes a first input coupled to the output of the NAND gate 326, a second input coupled to the output of the inverter 426, and an output. The inverter 430 includes an input coupled to the output of the NAND gate 428, and an output.

The set/reset latch 334 includes a clear input coupled to an output of an inverter 418 of the delay buffer 330, a set input coupled to the output of the inverter 430, a first output, and a second output. The NAND gate 328 includes an input coupled to the first output of the set/reset latch 334, an input coupled to the output of the Vin LVD detector 302 to receive the Vin_POR_detect signal 350, and an output. The inverter 432 includes an input coupled to the second output of the set/reset latch 334, and an output. The inverter 434 includes an input coupled to the output of the inverter 432, and an output coupled to the input of the level shifter 306 of FIG. 3.

The set/reset latch 336 includes a clear input coupled to the output of the Vin POR detector 108 to receive the Vin_POR_detect signal 126, a set input coupled to the output of the NAND gate 328, and an output coupled to an input of the AND gate 318. The level shifter 304 includes an input coupled to the bypass register 132 of the core circuitry 104 to receive the bypass request signal 120, an input coupled to the output of the inverter 408, and an output coupled to the first input of NAND gate 410.

The voltage regulator bypass circuit 106 can operate in substantially the same manner as the voltage regulator bypass control circuit 106 of FIGS. 1 and 3 to enter a bypass mode of the voltage regulator 102. For example, the voltage regulator bypass circuit 106 can enter the bypass mode of the voltage regulator 102 only when the test mode signal 124 is received on the external test pin 105, the Vcore POR detector 112 provides the Vcore_POR_detect signal 130, and then the Vin POR detector 108 provides the Vin_POR_detect signal 126. Each of the events has to occur in the correct sequence for the voltage regulator bypass control circuit 106 to enter the bypass mode of the voltage regulator 102.

While example embodiments of the logic elements of the voltage regulator bypass circuit 106 has been shown for purposes of illustration, one of ordinary skill in the art would appreciate that the same result can be generated using different logic elements without changing the overall operation of the circuit.

Figure 5:
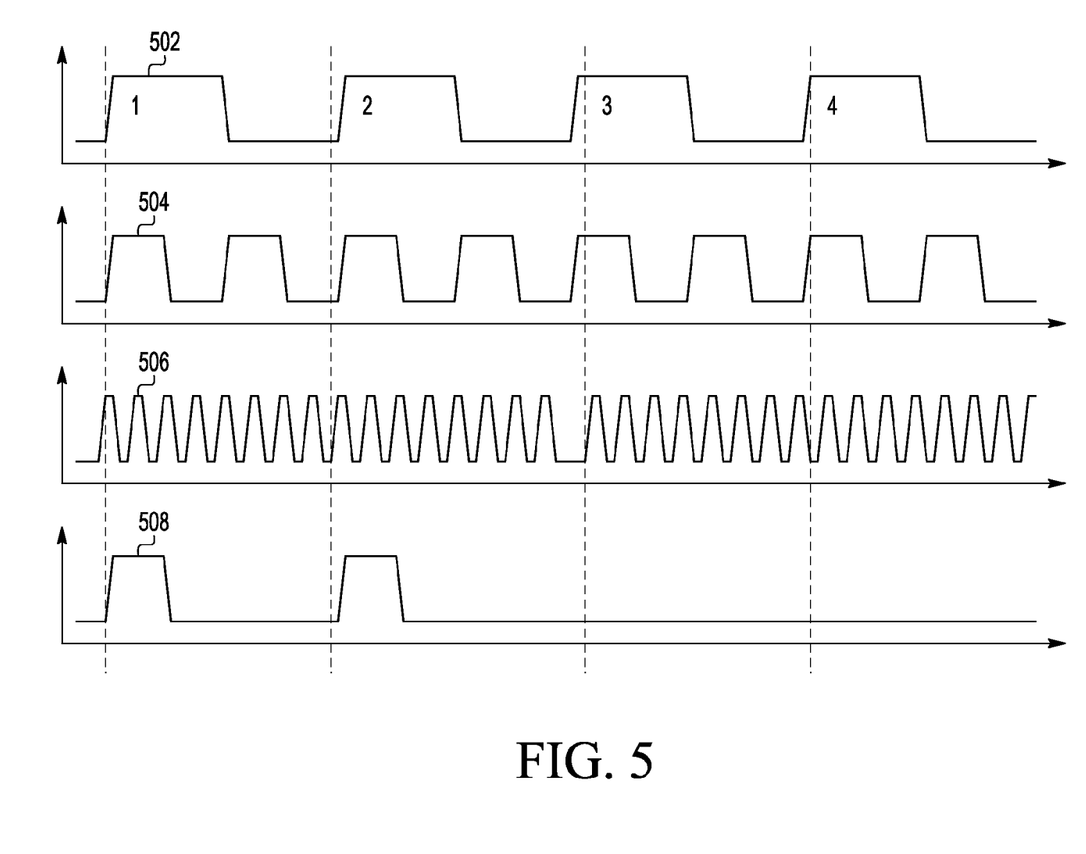
FIG. 5 is a timing diagram for the voltage regulator bypass circuit in accordance with at least one embodiment of the present disclosure.

FIG. 5 is a timing diagram for the voltage regulator bypass circuit including a test mode waveform 502, representing the test mode signal 124 of FIGS. 1, 3, and 4, a unregulated voltage waveform 504, representing the unregulated voltage Vin of FIGS. 1, 3, and 4, a core circuitry supply voltage waveform 506, representing the Vcore of FIGS. 1, 3, and 4, and a bypass mode waveform 508, representing the bypass mode signal 122 of FIGS. 1, 3, and 4. The different time points 1, 2, 3, and 4 along the waveforms can indicate different conditions that can cause the voltage regulator to be bypassed or not. At time point 1, the bypass mode waveform 508 transitions to a high logic voltage in response to the test mode waveform 502 and the core voltage waveform 506 transitioning to a high logic voltage before the unregulated voltage waveform 504 transitioning to a high logic voltage. The bypass output waveform 510 is maintained at the high voltage while the core voltage waveform 506 transitions between high and low voltage levels. The bypass output waveform 510 is then deasserted in response to the unregulated voltage waveform 504 transitioning to a low logic voltage. Similarly at time point 2, the bypass mode waveform 510 can transition to the high logic voltage in response to the test mode waveform 502 and the core voltage waveform 506 transitioning to the high logic voltage before the unregulated voltage waveform 504 transitioning to the high logic voltage. The bypass output waveform 510 is maintained at the high voltage while the core voltage waveform 506 transitions between high and low voltage levels. The bypass output waveform 510 is then deasserted in response to the unregulated voltage waveform 504 transitioning to a low logic voltage.

At time points 3 and 4, the core supply voltage waveform 506 is slightly delayed, such that the unregulated voltage waveform 504 transitions to the high logic voltage before the core supply voltage waveform 506. Thus, at time points 3 and 4, the bypass mode waveform 510 remains at a low logic voltage to indicate that the voltage regulator is not bypassed.

In accordance with one aspect of the present disclosure, a method for controlling a bypass of a voltage regulator of an integrated circuit (IC) device is provided. The method includes detecting a first condition including an assertion of a test mode signal at an external pin of the IC device. The method further includes detecting a second condition including a core circuitry supply voltage being above a first threshold. The method further includes detecting a third condition including the core circuitry supply voltage rising above the first threshold prior to an unregulated voltage supply rising above a second threshold. The method further includes bypassing the voltage regulator to enter a test mode in response to the first condition, the second condition, and the third condition being met.

In one embodiment, detecting the first condition includes asserting a first detect signal in response to detecting that the core circuitry voltage level is above the first threshold. In this embodiment, detecting the second condition includes asserting a second detect signal in response to detecting that the unregulated voltage is above the second threshold. In this embodiment, detecting the third condition includes asserting a bypass mode signal responsive to the first detect signal being asserted before the second detect signal. In this embodiment, bypassing the voltage regulator includes bypassing the voltage regulator responsive to the assertion of the bypass mode signal.

In one embodiment, the method further includes introducing a delay in a signal path of the first detect signal and the test mode signal. In this embodiment, the method further includes setting a latch to clear in response both to the assertion of the test mode signal and to the first detect signal being asserted before the second detect signal. In this embodiment, asserting the bypass mode signal includes asserting the bypass mode signal in response to setting the latch to clear. In one embodiment, the third condition further includes the unregulated supply voltage also being above a third threshold.

In one embodiment, the first threshold represents a voltage level expected for core circuitry of the IC device during a power-on reset of the IC device. In this embodiment, the second threshold represents a voltage level expected for the unregulated supply voltage during a power-on reset of the IC device. In this embodiment, the third threshold represents a minimum standby voltage expected to maintain the core circuitry in a standby state.

In one embodiment, the first threshold represents a voltage level expected for core circuitry of the IC device during a power-on reset of the IC device. In this embodiment, the second threshold represents a voltage level expected for the unregulated supply voltage during a power-on reset of the IC device. In one embodiment, the method further includes enabling the voltage regulator to enter a non-test mode in response to any of the first, second, or third conditions failing to be met. In one embodiment, bypassing the voltage regulator to enter a test mode includes powering core circuitry of the IC device using an externally-supplied test voltage. In this embodiment, enabling the voltage regulator to enter a non-test mode includes powering the core circuitry using a regulated voltage output by the voltage regulator.

In accordance with another aspect of the present disclosure, an integrated circuit (IC) device is provided. The IC device includes first, second, and third external pins. The IC device also includes a voltage regulator having an input coupled to the first external pin and an output. The IC device also includes core circuitry having an input coupled to the output of the voltage regulator and coupled to the second external pin. The IC device also includes a first voltage detector having an input coupled to the second external pin and an output. In this case, the first voltage detector is to assert a first detect signal at the output in response to detecting a voltage at the input of the core circuitry is above a first threshold. The IC device also includes a second voltage detector having an input coupled to the first external pin and an output. In this case, the second voltage detector is to assert a second detect signal in response to detecting that a voltage at the first external pin is above a second threshold. The IC device also includes a circuit having a first input coupled to the output of the first voltage detector and a second input coupled to the output of the second voltage detector, and a third input coupled to the third external pin. In this case, the circuit is to assert a bypass mode signal to disable the voltage regulator in response an assertion of a test mode signal at the third external pin and an assertion of the first detect signal at the first input prior to an assertion of the second detect signal at the second input.

In one embodiment, the circuit includes a latch. In this case, the latch is to assert the bypass mode signal in response to the assertion of the test mode signal and the first signal prior to the assertion of the second signal. In one embodiment, the IC device also includes a delay buffer in a signal path from the first voltage detector to the latch. In this case, the delay buffer is to introduce a delay to cause the assertion of the bypass mode signal only when both the assertion of the test mode signal and the assertion of the first signal occur prior to the assertion of the second signal.

In one embodiment, the IC device also includes a band-gap reference circuit to provide the first threshold voltage and the second threshold voltage. In one embodiment, the first threshold represents a voltage level expected for the core circuitry during a power-on reset of the IC device. In this embodiment, the second threshold represents a voltage level expected for the unregulated supply voltage during a power-on reset of the IC device. In one embodiment, the circuit further is to deassert a bypass mode signal to enable the voltage regulator in response either of: a lack of an assertion of a test mode signal at the third external pin or an assertion of the first detect signal at the first input subsequent to an assertion of the second detect signal at the second input. In one embodiment, the IC device is to power the core circuitry using an externally-supplied test voltage received via the second external pin in response to the bypass mode signal being asserted. In this embodiment, the IC device is to power the core circuitry using a regulated voltage at the output of the voltage regulator in response to the bypass mode signal being deasserted.

In accordance with another aspect of the present disclosure, a voltage regulator bypass circuit to control bypass of a voltage regulator of an integrated circuit (IC) device is provided. The voltage regulator bypass circuit includes a first voltage detector having an output. In this case, the first voltage detector is to detect that a core circuitry voltage level is above a first threshold and to assert a first detect signal at the output in response to the detection. The voltage regulator bypass circuit also includes a second voltage detector having an output. In this case, the second voltage detector is to detect that a unregulated supply voltage is above a second threshold and to assert a second detect signal at the output in response to the detection. The voltage regulator bypass circuit also includes a first circuit having a first input coupled to the output of the first voltage detector and a second input coupled to the output of the second voltage detector. In this case, the first circuit includes a latch coupled to the output of first voltage detector to the output of and the second voltage detector. In this case, the latch is to receive a first signal indicating both a detection of an assertion of a test mode signal and the first detect signal. In this case, the latch is further to receive a second signal indicating a detection of the second detect signal. In this case, the latch is further to clear the output of the latch when the first signal is received before the second signal. The first circuit also includes a second circuit coupled to the output of the latch. In this case, the second circuit is to bypass the voltage regulator in response the output of the latch being cleared.

In one embodiment, the first threshold represents a voltage level expected for core circuitry of the IC device during a power-on reset of the IC device. In this embodiment, the second threshold represents a voltage level expected for the unregulated supply voltage during a power-on reset of the IC device. In one embodiment, the latch is to output a bypass mode indication signal to the first circuit in response to detection of the first detect signal and the test mode signal prior to the detection of the second detect signal. In one embodiment, the voltage regulator bypass circuit also includes a third voltage detector having an output. In this case, the third voltage detector is to detect that the unregulated supply voltage is also above a third threshold. In one embodiment, the third threshold represents a minimum voltage level expected for an operation of the IC device.

In this document, the terms "asserted" and "negated" refer to relative logic levels of a particular signal, and do not refer to a particular signal level. Thus, for example, a signal in an asserted state could have a relatively lower current or voltage level relative to the signal in a negated state. Another signal in an asserted state could have a relatively higher current or voltage level relative to the signal in a negated state. Further, different signals could have different relative levels in their respective asserted and negated states. Thus, for example, one signal in an asserted state could have a relatively lower current or voltage level relative to the signal in a negated state while a different signal in an asserted state could have a relatively higher current or voltage level relative to the signal in a negated state.

In this document, relational terms such as "first" and "second", and the like, may be used solely to distinguish one entity or action from another entity or action without necessarily requiring or implying any actual such relationship or order between such entities or actions. The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method for controlling a bypass of a voltage regulator of an integrated circuit (IC) device, the method comprising:
   detecting a first condition comprising an assertion of a test mode signal at an external pin of the IC device;
   detecting a second condition comprising a core circuitry supply voltage being above a first threshold;
   detecting a third condition comprising the core circuitry supply voltage rising above the first threshold prior to an unregulated voltage supply rising above a second threshold; and
   bypassing the voltage regulator to enter a test mode in response to the first condition, the second condition, and the third condition being met.

2. The method of claim 1, wherein:
   detecting the second condition further comprises asserting a first detect signal in response to detecting that the core circuitry voltage level is above the first threshold;
   detecting the second condition further comprises asserting a second detect signal in response to detecting that the unregulated voltage is above the second threshold;
   detecting the third condition comprises asserting a bypass mode signal responsive to the first detect signal being asserted before the second detect signal; and
   bypassing the voltage regulator comprises bypassing the voltage regulator responsive to the assertion of the bypass mode signal.

3. The method of claim 2, further comprising:
   introducing a delay in a signal path of the first detect signal and the test mode signal;
   setting a latch to clear in response both to the assertion of the test mode signal and to the first detect signal being asserted before the second detect signal; and
   asserting the bypass mode signal comprises asserting the bypass mode signal in response to setting the latch to clear.

4. The method of claim 1, wherein the third condition further comprises the unregulated supply voltage also being above a third threshold.

5. The method of claim 4, wherein:
   the first threshold represents a voltage level expected for core circuitry of the IC device during a power-on reset of the IC device;
   the second threshold represents a voltage level expected for the unregulated supply voltage during a power-on reset of the IC device; and
   the third threshold represents a minimum standby voltage expected to maintain the core circuitry in a standby state.

6. The method of claim 1, wherein:
   the first threshold represents a voltage level expected for core circuitry of the IC device during a power-on reset of the IC device; and
   the second threshold represents a voltage level expected for the unregulated supply voltage during a power-on reset of the IC device.

7. The method of claim 1, further comprising:
   enabling the voltage regulator to enter a non-test mode in response to any of the first, second, or third conditions failing to be met.

8. The method of claim 7, wherein:
   bypassing the voltage regulator to enter the test mode comprises powering core circuitry of the IC device using an externally-supplied test voltage; and
   enabling the voltage regulator to enter the non-test mode comprises powering the core circuitry using a regulated voltage output by the voltage regulator.

9. A method for controlling a bypass of a voltage regulator of an integrated circuit (IC) device, the method comprising:
   detecting a first condition comprising an assertion of a test mode signal at an external pin of the IC device;
   detecting a second condition comprising a core circuitry supply voltage rising above a first threshold prior to an unregulated voltage supply rising above a second threshold; and
   bypassing the voltage regulator to enter a test mode in response to the first condition and the second condition being met.

10. The method of claim 9, wherein:
    detecting the second condition comprises asserting a first detect signal in response to detecting that the core circuitry voltage level is above the first threshold;
    asserting a second detect signal in response to detecting that the unregulated voltage is above the second threshold;
    detecting the second condition comprises asserting a bypass mode signal responsive to the first detect signal being asserted before the second detect signal; and
    bypassing the voltage regulator comprises bypassing the voltage regulator responsive to the assertion of the bypass mode signal.

11. The method of claim 10, further comprising:
    introducing a delay in a signal path of the first detect signal and the test mode signal;
    setting a latch to clear in response both to the assertion of the test mode signal and to the first detect signal being asserted before the second detect signal; and
    asserting the bypass mode signal comprises asserting the bypass mode signal in response to setting the latch to clear.

12. The method of claim 9, wherein the second condition further comprises the unregulated supply voltage also being above a third threshold.

13. The method of claim 12, wherein:
    the first threshold represents a voltage level expected for core circuitry of the IC device during a power-on reset of the IC device;
    the second threshold represents a voltage level expected for the unregulated supply voltage during a power-on reset of the IC device; and
    the third threshold represents a minimum standby voltage expected to maintain the core circuitry in a standby state.

14. The method of claim 9, wherein:
    the first threshold represents a voltage level expected for core circuitry of the IC device during a power-on reset of the IC device; and
    the second threshold represents a voltage level expected for the unregulated supply voltage during a power-on reset of the IC device.

15. The method of claim 9, further comprising:
    enabling the voltage regulator to enter a non-test mode in response to either of the first or second conditions failing to be met.

16. The method of claim 15, wherein:
    bypassing the voltage regulator to enter the test mode comprises powering core circuitry of the IC device using an externally-supplied test voltage; and enabling the voltage regulator to enter the non-test mode comprises powering the core circuitry using a regulated voltage output by the voltage regulator.

17. A method for controlling a bypass of a voltage regulator of an integrated circuit (IC) device, the method comprising:

detecting an assertion of a test mode signal at an external pin of the IC device;

asserting a bypass mode signal responsive to a core circuitry supply voltage rising above a first threshold prior to an unregulated voltage supply rising above a second threshold; and bypassing the voltage regulator to enter a test mode of the IC device in response to the assertion of the test mode signal and the bypass mode signal, otherwise enabling the voltage regulator to enter a non-test mode in response to either of the test mode signal or the bypass mode signal failing to be asserted.

18. The method of claim 17, wherein:

the first threshold represents a voltage level expected for core circuitry of the IC device during a power-on reset of the IC device; and the second threshold represents a voltage level expected for the unregulated supply voltage during a power-on reset of the IC device.

19. The method of claim 17, wherein:

bypassing the voltage regulator to enter the test mode comprises powering core circuitry of the IC device using an externally-supplied test voltage; and enabling the voltage regulator to enter a non-test mode comprises powering the core circuitry using a regulated voltage output by the voltage regulator.

20. The method of claim 1, further comprising:

detecting that the unregulated supply voltage also being above a third threshold, and wherein the third threshold represents a minimum standby voltage expected to maintain the core circuitry in a standby state.

* * * * *